(12) United States Patent
Knights

(10) Patent No.: US 7,550,846 B2
(45) Date of Patent: Jun. 23, 2009

(54) CONDUCTIVE BUMP WITH A PLURALITY OF CONTACT ELEMENTS

(75) Inventor: John C. Knights, Soquel, CA (US)

(73) Assignee: Palo Alto Research Center, Palo Alto, CA (US)

( * ) Notice: Subject to any disclaimer, the term of this patent is extended or adjusted under 35 U.S.C. 154(b) by 0 days.

(21) Appl. No.: 11/315,138

(22) Filed: Dec. 21, 2005

(65) Prior Publication Data

US 2007/0138649 A1 Jun. 21, 2007

(51) Int. Cl.
*H01L 23/48* (2006.01)
*H01L 21/44* (2006.01)

(52) U.S. Cl. ............... 257/738; 257/781; 438/612; 438/614

(58) Field of Classification Search ............... None
See application file for complete search history.

(56) References Cited

U.S. PATENT DOCUMENTS

| 5,225,966 | A | * | 7/1993 | Basavanhally et al. ...... 361/774 |
| 5,955,784 | A | * | 9/1999 | Chiu .......................... 257/737 |
| 6,077,380 | A | * | 6/2000 | Hayes et al. ................. 156/283 |
| 6,610,591 | B1 | * | 8/2003 | Jiang et al. .................. 438/613 |
| 7,060,602 | B2 | * | 6/2006 | Saito .......................... 438/612 |
| 7,208,842 | B2 | * | 4/2007 | Jeong ......................... 257/781 |
| 2002/0041036 | A1 | * | 4/2002 | Smith ......................... 257/778 |
| 2006/0249856 | A1 | * | 11/2006 | Yamada et al. .............. 257/783 |
| 2007/0023907 | A1 | * | 2/2007 | Fork et al. ................... 257/738 |
| 2007/0023908 | A1 | * | 2/2007 | Fork et al. ................... 257/738 |

* cited by examiner

*Primary Examiner*—Alonzo Chambliss
(74) *Attorney, Agent, or Firm*—Marger Johnson & McCollom, PC

(57) ABSTRACT

A method of forming a contact structure and a contact structure. The contact structure includes a contact location, and contact elements disposed substantially on the contact location, at least one such contact element including a deformable center and a conducting layer covering at least a part of the deformable center.

17 Claims, 5 Drawing Sheets

CONDUCTIVE BUMP WITH A PLURALITY OF CONTACT ELEMENTS

BACKGROUND

A connection between an electronic device and a substrate may be achieved using an anisotropic conducting film (ACF). Conductive bumps are formed on the electronic device. The locations of the conductive bumps correspond to contact pads on the substrate. An ACF is placed between the electronic device and the substrate. By applying pressure, a connection is made between the electronic device and the substrate.

An ACF has conducting spheres suspended throughout a deformable film. When pressure is applied in one direction between connection points on opposite sides of the film, the spheres contact each other and the connection points, creating a conductive path. Because pressure is applied in one direction, spheres in an orthogonal direction may not contact each other. Thus, a conductive path is formed between opposite sides of the film, but not between adjacent connection points on one side of the film.

However, because the conducting spheres are distributed throughout an ACF, as the pitch of the connection points connected using the ACF is reduced, the likelihood of spheres contacting each other in a direction orthogonal to the direction of the applied pressure increases. Thus, ACF has an inherent limitation on the lateral spacing of connection points.

SUMMARY

An embodiment includes a contact structure including a contact location, and contact elements disposed substantially on the contact location, at least one such contact element including a deformable center and a conducting layer covering at least a part of the deformable center.

Another embodiment includes a method of forming a contact structure including providing contact elements having deformable centers and conducting layers, suspending the contact elements in a carrier fluid, depositing the carrier fluid substantially on a contact location using an ink jet; and evaporating the carrier fluid from the contact elements.

DETAILED DESCRIPTION

Throughout the drawings, elements, layer, coatings, etc. are shown with particular dimensions. These dimensions may have been chosen for ease of illustration. The dimensions are as described in the specification or as understood by one of ordinary skill in the art.

Figure 1:
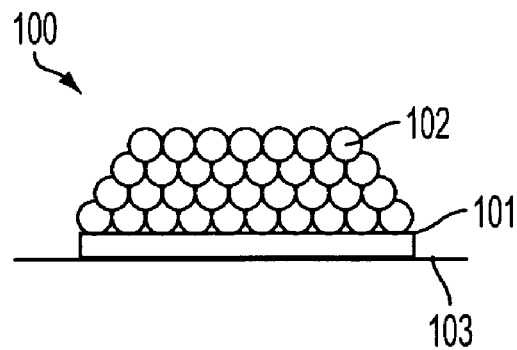
FIG. 1 shows a contact structure formed by jet printing.

FIG. 1 shows a contact structure 100 formed by jet printing. The contact structure includes a contact location 101 and contact elements 102. A contact location 101 may be a conductive trace, a contact pad, or any other structure that allows connection to an electronic device. The contact location 101 may be formed on a substrate 103. Such a substrate 103 may be glass, ceramic, a printed circuit board, or any other substrates suitable for mounting electronic devices.

Figure 2:
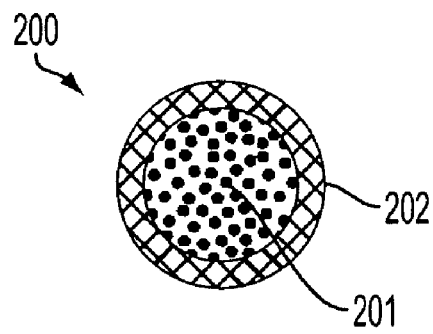
FIG. 2 shows a cross sectional view of a contact element of a contact structure.

FIG. 2 shows a cross sectional view of an example of a contact element 200 of a contact structure 100. A contact element 200 may include a deformable center 201 and a conducting layer 202. The deformable center 201 may be formed of a polymer. The conducting layer 202 may be a metal layer, multiple metal layers, or a layer of another conductive substance. For example, the conducting layer 202 may be formed of a nickel layer surrounded by a gold layer. However, the conducting layer 202 need not surround the entire deformable center 201. For example, the conducting layer 202 may be formed only on a part of the deformable center 201.

Figure 3:
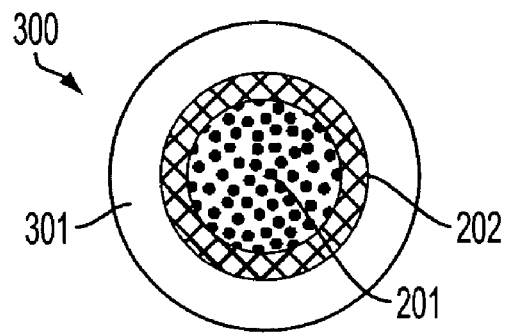
FIG. 3 shows a cross sectional view of a contact element having a coating.

FIG. 3 shows a cross sectional view of another example of a contact element 300 having a coating 301. A contact element 300 may have a coating 301. The coating 301 may be formed of a polymer. The polymer forming the coating 301 may be more deformable than the deformable center 201. Thus, when pressure is applied, the coating 301 may deform more than the deformable center 201, allowing contact between conducting layers 202 of adjacent contact elements 102 of FIG. 1.

The contact may occur as a result of the pressure of another surface against the contact element 300. As pressure is applied by the other surface, the coating 301 deforms to an extent, forming a contact between the surface and the conducting layer 202. Such a surface may be a surface of a conducting layer 202 of another contact element 102, a surface of a contact location 101, a surface of a connection to a device such as a conductive ball, or any other surface capable of forming an electrical connection. The deformable center 201, less deformable that the coating 301, may provide physical resistance to pressure on the coating 301, causing the coating 301 to deform.

Alternatively, the coating 301 may be formed of an adhesive. Thus, when pressure is applied, the adhesive may spread from the contact elements 300, both allowing contact between the contact elements 300 and moving the adhesive to areas between the contact elements 300. In addition, the adhesive may contact the contact location 101 and a contact structure of a device (not shown) connecting to the contact structure 100. As a result, the adhesive may hold the contact elements 300 in contact with each other, hold some contact elements 300 in contact with the contact location 101, and hold some contact elements 300 in contact with the contact structure of the device.

Referring to FIG. 1, alternatively, and in addition, an adhesive, not forming a part of the contact elements 102, may be located substantially between the contact elements 102. The contact elements 102 used with the adhesive may or may not have a coating 301. For example, if the coating 301 of some of the contact elements 102 is not an adhesive, or the coating 301 is not present, the adhesive between the contact elements 102 may hold the contact elements 102 as described above. Alternatively, if the a coating 301 of some contact elements 102 includes an adhesive as described above, the adhesive between the contact elements 102 may operate in conjunction with or in addition to the adhesive of the coating 301.

Figure 4:
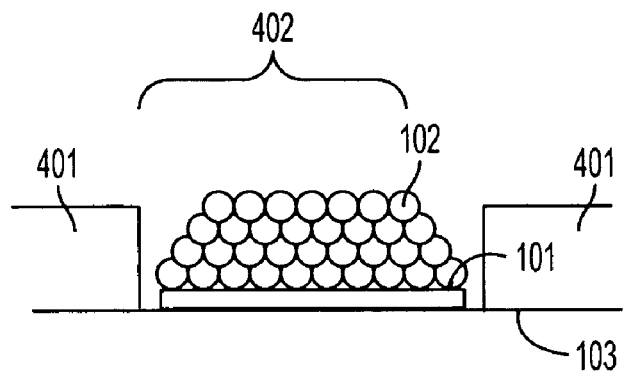
FIG. 4 shows a contact structure substantially surrounded by a non-conductive structure.

FIG. 4 shows a contact structure substantially surrounded by a non-conductive structure. The non-conductive structure 401 substantially surrounds the contact location 101. Such a non-conductive structure 401 may form a well 402 substantially at the contact location 101. Thus, the contact elements 102 on the contact location 101 may be disposed substantially in the well 402. The walls of the well 402 may help contain the contact elements 102 to the area of the contact location 101. Although FIG. 4 shows all of the contact elements 102 located in the well 402, some contact elements 102 may be located outside of the well 402. For example, if a number of contact elements 102 are deposited, the number greater than may physically be located in the well 402 without compression, some contact elements 102 may be located on the non-conductive structure 401 adjacent to the well 402.

The thickness of the non-conductive structure 401 may be substantially equal to the thickness of the contact elements 102 on the contact location 101. Thus, when a device is connected to the contact location 101 through the contact elements 102, the non-conductive structure 401 may support the device outside of the contact location 101.

In addition, the thickness of the non-conducting structure 401 may be different from the thickness of the contact elements 102 on the contact location 101. For example when mounting a device having a pad without a conductive ball formed on the pad, a thickness of the contact elements 102, greater than the thickness of the non-conductive structure 401 may ensure contact between the contact elements 102 and the pad of the device before significant compression of the non-conductive structure 401. Alternatively, the thickness of the contact elements 102 may be less than the thickness of the non-conductive structure 401 to accommodate a ball formed on a pad of a device to avoid significant compression of the ball before the device contacts the non-conductive structure 401.

Furthermore, the non-conductive structure 401 may include an adhesive. Similar to the adhesive that may be between the contact elements, the adhesive of the non-conductive structure 401 may bond to the substrate 103 and a device mounted on the substrate 103.

In addition, the non-conducting structure 401 may be formed of insulating elements. The insulating elements may be formed similarly to the contact elements 102, omitting the conductive layer 202. Thus, the insulating elements may make up the structure of the non-conductive structure 401. The adhesive of the non-conductive structure 401 may be disposed between the insulating elements. The insulating elements may optionally have the coating 301 of the contact elements 102. The coating 301 of the insulating elements may similarly be an adhesive. Although the insulating elements have been described as similar to the contact elements 102, in a contact structure 100 and an associated non-conducting structure 401, the insulating elements and the contact elements 102 are not required to have the same construction. For example, the contact elements 102 may have no coating 301 at all, while the insulating elements have an adhesive as a coating 301.

By forming the non-conductive structure 401 from the insulating elements having a deformable center similar to the contact elements 102, the insulating elements and the contact elements 102 may have the same physical resistance to pressure. Thus, a device, installed over such a non-conductive structure 401, may have any pressure applied to the device spread equally over the surface of the device contacting the non-conductive structure 401 and any contact structures 100.

As described above, both the contact elements 102 and insulating elements that may form a non-conductive structure 401 may include a deformable center 201. Such a deformable center 201 may be a thermosetting material. In addition, the coating 301 of any contact elements 102 and insulating elements may also be a thermosetting material. Furthermore, an adhesive disposed between the contact elements 102 may be a thermosetting material.

The thermosetting material aids in maintaining a connection. For example, during installation of a device on a contact structure 100, the connection may be formed through the contact elements 102 by applying pressure. By applying heat while applying the pressure, the contact structure and any non-conductive structure 401 may be set, maintaining the connection after the pressure is removed. In addition, if the non-conductive structure 401 or the contact structure 100 contain an adhesive, the device may be bonded to the substrate 103.

Although all of the contact elements 102, insulating elements of a non-conductive structure 401, and an adhesive between such elements have been described as including a thermosetting material, not all need to have such a thermosetting material. For example, only some of the insulating elements of the non-conductive structure 401 may have a thermosetting material. Thus, those insulating elements may set, holding the other elements in place. Alternatively, only the adhesive disposed between the contact elements 102 may be thermosetting. Any combination is possible to achieve the desired degree of attachment.

The non-conductive structure 401 may include a material that repels a carrier fluid. If the contact elements 102 are suspended in the carrier fluid, the area substantially outside of the contact location 101 may have a carrier fluid repelling material. For example, as described above, a non-conducting structure 401 may be formed outside of the contact location 101. An exemplary non-conductive structure 401 may repel water. Thus, if water is used as the carrier fluid, then the non-conductive structure 401 would be a carrier fluid repelling material. Thus, the contact elements suspended in the contact fluid may be repelled from the non-conductive structure 401 having the carrier fluid repelling material and may be directed towards areas that do not have such a carrier fluid repelling material, such as the contact location 101.

In addition, the contact location 101 may include a material that attracts the carrier fluid. For example, a metal, such as gold, may be a material that attracts a carrier fluid, such as water. Thus, if the contact location includes such a material, contact elements 102 suspended in the carrier fluid may be attracted to the contact location 101 along with the carrier fluid.

Although materials having carrier fluid attractive or repelling properties have been described, one of ordinary skill in the art will understand that it is the affinity of the material of the contact location 101 relative to the affinity of the material outside of the contact location 101 that is of interest. For example, both the contact location 101 and the material outside of the contact location 101 may repel the carrier fluid. If the contact location 101 repels the carrier fluid to a lesser degree than the material outside of the contact location 101, the carrier fluid may be drawn to the contact location 101. The relative difference in the carrier fluid affinity causes the carrier fluid to be drawn to the material with the lesser degree of repulsion.

Figure 5:
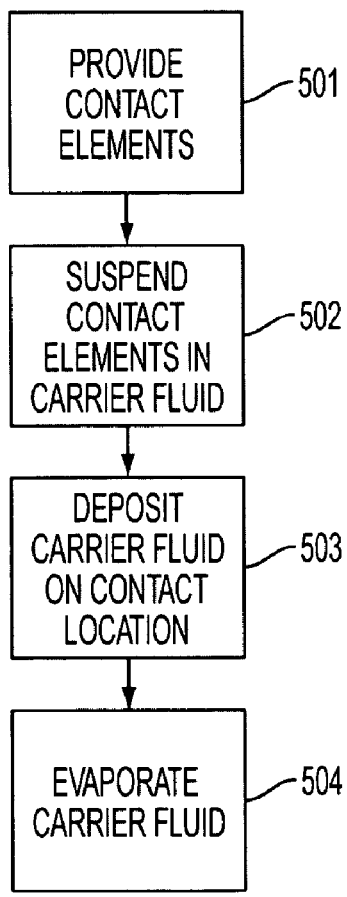
FIG. 5 shows a flowchart of a method of forming a contact structure by jet printing.

FIG. 5 shows a flowchart of a method of forming a contact structure by jet printing. An example of such a method includes providing contact elements having deformable centers and conducting layers in 501, suspending the contact elements in a carrier fluid in 502, depositing the carrier fluid substantially on a contact location using an ink jet in 503, and evaporating the carrier fluid from the contact elements in 504.

As described above, the contact elements may have deformable centers and conducting layers. These contact elements are suspended in a carrier fluid. Such a carrier fluid may include fluids such as water, alcohol, acetone, and other fluids and combinations of fluids suitable for suspending the contact elements. Furthermore, the carrier fluid may contain an adhesive. The adhesive may be dissolved in the carrier fluid or the adhesive may be suspended in the carrier fluid.

Figure 6:
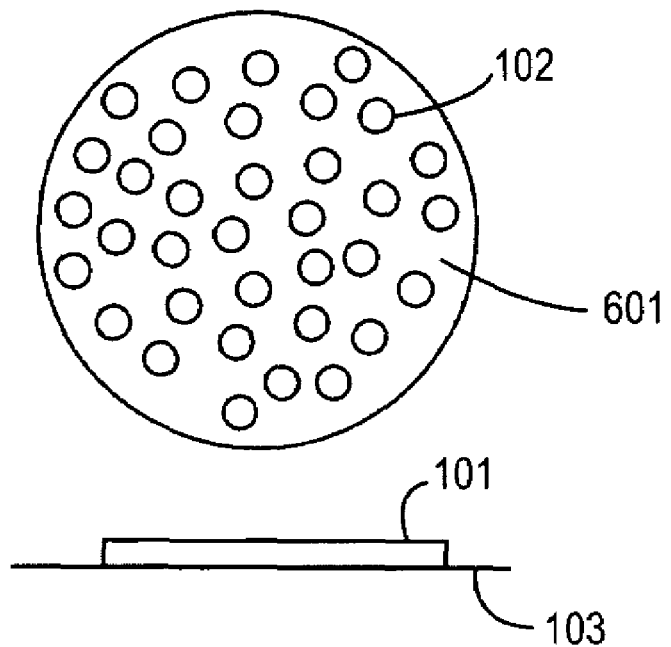
FIG. 6 shows a carrier fluid suspending contact elements being deposited on a contact location.

FIG. 6 shows a carrier fluid 601 suspending contact elements 102 being deposited on a contact location 101. The carrier fluid 601 may be deposited in one drop on the contact location 101. Because of surface tension, the drop may remain in the location that it was deposited.

Such deposition may be implemented using an ink jet. In an ink jet deposition process, a substance suspended in a fluid is deposited through a jet. In this case, the substance includes the contact elements 102 and the fluid includes a carrier fluid 601 for the contact elements.

The ink jet moves relative to the surface of the substrate. This may be accomplished by moving the ink jet itself, moving the substrate, or a combination of both. Regardless, the ink jet passes over locations of the substrate. When the ink jet passes over a location that includes a desired contact location, the ink jet may deposit one or more drops of the carrier fluid 601 containing the contact elements 102. Thus, as the ink jet moves over the surface of the substrate, the carrier fluid 601 containing the contact elements 102 may be deposited at any desired contact locations.

It is desirable to contain the contact elements 102 to the contact location 101. If the contact elements 102 are deposited too far outside the desired contact location 101, the contact elements 102 may contact an adjacent contact location (not shown), forming an undesired connection. However, by suspending the contact elements 102 in the carrier fluid 601, the surface tension of the carrier fluid 601 holds the contact elements to the location where the carrier fluid 601 was deposited. Initially, this area may be larger than the desired contact location 101.

Figure 7:
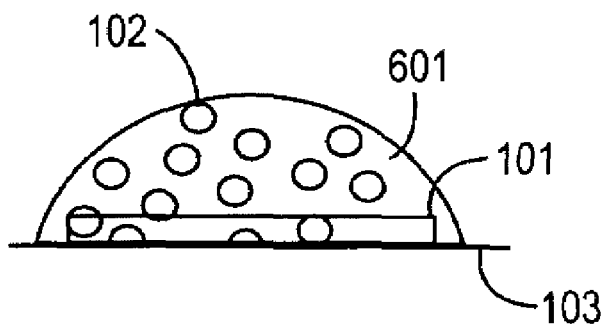
FIG. 7 shows a contact location as the carrier fluid evaporates.

Referring to FIG. 5, the carrier fluid is then evaporated in 504. FIG. 7 shows a contact location 101 as the carrier fluid evaporates. As the carrier fluid 601 evaporates the surface tension of the remaining carrier fluid 601 pulls the suspended contact elements 102 closer together. Eventually, substantially all of the carrier fluid 601 evaporates, leaving the contact elements 102 and any other substances or particles that were dissolved or suspended in the carrier fluid 601 on the contact location 101. The contact elements may or may not be accompanied by other substances or particles. For example, an adhesive that was dissolved within the carrier fluid 601 may not evaporate and may be dispersed throughout the contact elements 102 on the contact location 101.

To ensure that the contact elements 102 are moved along with the contracting carrier fluid 601 as it evaporates, it is desirable that the carrier fluid 601 is selected to have a surface tension equal to or greater than that required to move the contact elements 102 to the contact location 101. Thus, as the carrier fluid 601 contracts, a sufficient force is exerted on the contact elements 102 to pull them from the larger area of the initial drop of the carrier fluid 601 towards the center of the drop.

Figure 8:
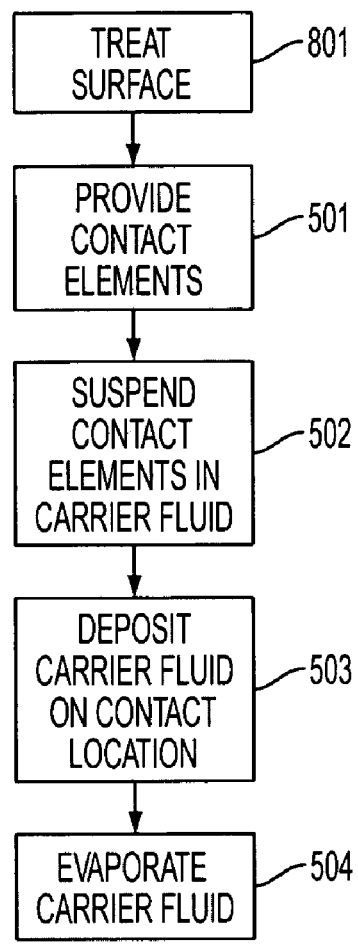
FIG. 8 shows a flowchart of a method of forming a contact structure by jet printing including treating a surface.

FIG. 8 shows a flowchart of a method of forming a contact structure by jet printing including treating a surface. The surface is treated in 801. As described above the contact location may include a material with an increased affinity for the carrier fluid. A material may be deposited that has an increased affinity for the carrier. Thus, the contact location then has an increased affinity for the carrier fluid. Although treating a surface has been described prior to providing the contact elements, the treating may occur at any time prior to the deposition of the carrier fluid containing the contact elements.

Alternatively, a material may be deposited substantially outside of the contact location having a decreased affinity for the carrier fluid. Thus, when deposited the material decreases the affinity for the carrier fluid of the areas outside of the contact location. Thus, the contact location has a relatively greater affinity for the carrier fluid.

Although treating the contact location and the areas outside of the contact location have been described individually, both such treatments may be performed on the same structure. For example, the contact location may have a material with an increased affinity for the carrier fluid applied to it and the areas outside of the contact structure may have a material with a decreased affinity for the carrier fluid applied to it.

Although the degree of attraction and repulsion of a surface to a carrier fluid has been described as an affinity, the affinity may be referred to as the wettability of the surface by the carrier fluid. Furthermore, the characteristic of wettability is not limited to water as the carrier fluid. For example, a surface may have a degree of wettability with respect to an alcohol.

A method of forming a contact structure may additionally include forming a non-conductive layer outside of the contact location. Such a layer may be a deformable polymer coating deposited outside of the contact location. The deformable polymer layer may be directly deposited.

Figure 9:
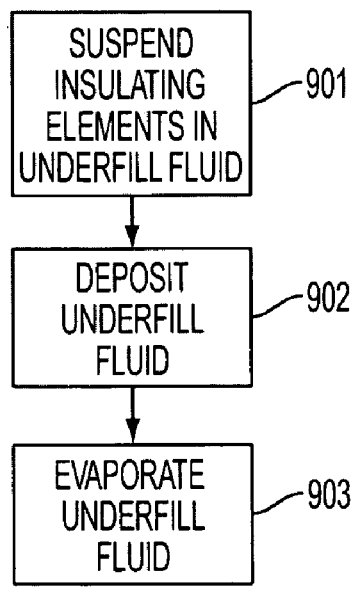
FIG. 9 shows a flowchart of a method of forming a contact structure by jet printing including depositing insulating elements.

Alternatively, referring to FIG. 9, the deformable polymer layer may be formed of the insulating elements described above. By suspending the insulating elements in a carrier fluid in 901, the insulating elements may be deposited where desired outside of the contact location in 902. Such deposition may be by ink jet as described above with respect to the contact elements suspended in the respective carrier fluid. Such a carrier fluid suspending the insulating elements may be referred to as an underfill fluid to distinguish it from a carrier fluid suspending contact elements. Regardless of the nomenclature, either the carrier fluid or the underfill fluid may include the same or different elements, the main difference being that the underfill fluid would not contain contact elements. The underfill fluid is then evaporated, leaving the insulating elements behind in 903.

When such an underfill fluid is deposited, it may form a well on the contact location. The carrier fluid is then deposited in the well. As a result, the contact elements are more likely to remain on the contact location than if the well was not formed.

In addition, forming the non-conductive layer may include depositing a porous polymer outside of the contact location. Then an optional continuous layer may be formed on the porous polymer layer. Thus, a deformable non-conductive layer is formed outside of the contact location.

Although methods have been described with single depositing of fluids, such as depositing a carrier fluid or an underfill fluid, each of the depositions may be repeated as desired to create the desired structure. For example, multiple depositions of a carrier fluid with contact elements may be used. A first pass deposits the carrier fluid. Then the carrier fluid evaporates, leaving the contact elements. A second pass deposits more carrier fluid on the same contact location, building up the contact elements on the contact location. Similarly, multiple passes may be used when forming a non-conductive structure.

Figure 10:
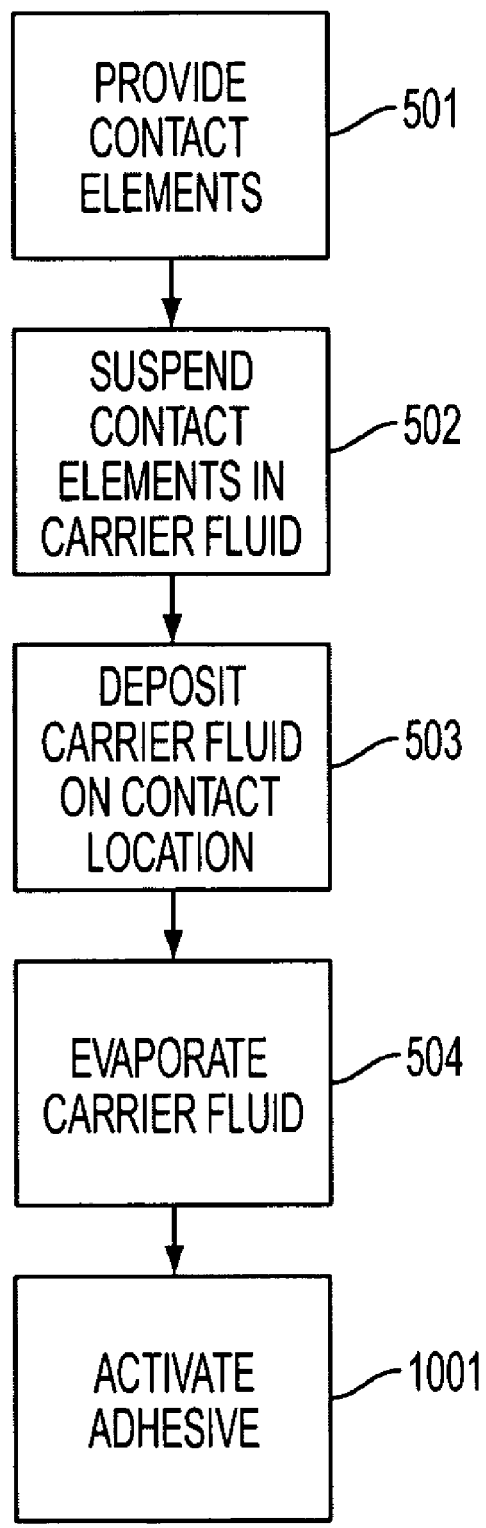
FIG. 10 shows a flowchart of a method of forming a contact structure by jet printing including activating an adhesive.

FIG. 10 shows a flowchart of a method of forming a contact structure by jet printing including activating an adhesive. As described above elements and carrier fluids may contain adhesive. The adhesive layers may be activated in 1001 the after a device has been installed on the contact structure. Thus, the device may be bonded to the substrate maintaining the pressure and structure as it existed under the applied pressure to maintain a connection through the contact elements.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. A contact structure comprising:
    a contact location including a conductive structure disposed on a substrate; and
    a plurality of contact elements disposed substantially on the conductive structure, each such contact element including a deformable center and a conducting layer covering at least a part of the deformable center;
    wherein a melting point of the conducting layer is higher than a melting point of the deformable center.

2. The contact structure of claim 1, at least one such contact element including the conducting layer further comprising a coating substantially covering the conducting layer.

3. The contact structure of claim 2, for at least one such contact element including the coating, the coating being more deformable than the deformable center.

4. The contact structure of claim 2, for at least one such contact element including the coating, the coating further comprising an adhesive.

5. The contact structure of claim 1, further comprising an adhesive disposed substantially between the contact elements.

6. The contact structure of claim 1, further comprising a non-conductive structure substantially surrounding the contact location.

7. The contact structure of claim 6, the non-conductive structure forming a well substantially at the contact location and the contact elements disposed substantially in the well.

8. The contact structure of claim 1, the deformable center further comprising a thermosetting material.

9. The contact structure of claim 1, wherein a position of the contact elements on the contact location is defined by at least one drop of a carrier fluid suspending the contact elements during deposition of the contact elements.

10. The contact structure of claim 9, the at least one drop of carrier fluid containing the contact elements deposited by an ink-jet.

11. The contact structure of claim 9, wherein an initial spread of the at least one drop of carrier fluid is larger than an area of the contact location.

12. The contact structure of claim 9, wherein substantially all the contact elements are disposed within an area of the contact location in a shape due to an evaporation of the carrier fluid.

13. The contact structure of claim 1, further comprising at least one selected from the group consisting of:
    a carrier fluid repelling material disposed substantially outside of the contact location; and
    a carrier fluid attractive material disposed substantially on the contact location.

14. A contact structure comprising:
    a contact location including a conductive structure disposed on a substrate; and
    a plurality of contact elements disposed substantially on the conductive structure, each such contact element including a deformable center and a conducting layer covering at least a part of the deformable center, at least one such contact element including the conducting layer further comprising a coating substantially covering the conducting layer;
    wherein the coating includes an adhesive and a melting point of the conducting layer is higher than a melting point of the deformable center.

15. A contact structure comprising:
    a first contact location including a first conductive structure disposed on a first substrate;
    a second contact location including a second conductive structure disposed on a second substrate; and
    a plurality of contact elements disposed substantially between the first contact location and the second contact location, each contact element including a deformable center and a conducting layer covering at least a part of the deformable center;
    a non-conductive structure disposed between the first substrate and the second substrate, the non-conductive structure substantially surrounding the first contact location and the second contact location wherein the non-conductive structure includes a plurality of insulating elements, each insulating element including a deformable center.

16. The contact structure of claim 15, wherein:
    the deformable center for each contact element and each insulating element has a similar resistance to pressure.

17. The contact structure of claim 15, wherein:
    the second contact location includes a conductive ball; and
    the contact elements are disposed between the conductive ball and the first contact location.

* * * * *

UNITED STATES PATENT AND TRADEMARK OFFICE
CERTIFICATE OF CORRECTION

PATENT NO.         : 7,550,846 B2
APPLICATION NO. : 11/315138
DATED              : June 23, 2009
INVENTOR(S)       : John C. Knights It is certified that error appears in the above-identified patent and that said Letters Patent is hereby corrected as shown below:

On the Title Page, section (73), the Assignee "Palo Alto Research Center", should read -- Palo Alto Research Center Incorporated --.

Signed and Sealed this

Twenty-fourth Day of November, 2009

David J. Kappos
*Director of the United States Patent and Trademark Office*